(12) United States Patent
Fort et al.

(10) Patent No.: US 10,673,431 B2
(45) Date of Patent: Jun. 2, 2020

(54) ELECTRONIC CIRCUIT WITH DEVICE FOR MONITORING A POWER SUPPLY USING A TRIP THRESHOLD CHOSEN FROM A RANGE OF VOLTAGES AROUND A BAND GAP VOLTAGE

(71) Applicant: STMicroelectronics (Rousset) SAS, Rousset (FR)

(72) Inventors: Jimmy Fort, Puyloubier (FR); Nicolas Borrel, Martigues (FR); Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/161,533

(22) Filed: Oct. 16, 2018

(65) Prior Publication Data

US 2019/0123737 A1    Apr. 25, 2019

(30) Foreign Application Priority Data

Oct. 20, 2017    (FR) ..................... 17 59914

(51) Int. Cl.
*H03K 17/22*    (2006.01)
*G01R 19/165*    (2006.01)
(Continued)

(52) U.S. Cl.
CPC ..... *H03K 17/223* (2013.01); *G01R 19/16552* (2013.01); *G05F 3/267* (2013.01);
(Continued)

(58) Field of Classification Search
CPC ........ H03K 17/223; H03K 17/22; G05F 3/30; G05F 3/245; G05F 3/247; G05F 3/262;
(Continued)

(56) References Cited

U.S. PATENT DOCUMENTS 5,920,182 A    7/1999   Migliavacca
7,274,250 B2   9/2007   Hazucha et al.
(Continued)

FOREIGN PATENT DOCUMENTS

FR    3001060 A1    7/2014

OTHER PUBLICATIONS

INPI Search Report and Written Opinion for FR 1759914 dated May 25, 2018 (7 pages).

*Primary Examiner* — Long Nguyen
(74) *Attorney, Agent, or Firm* — Crowe & Dunlevy

(57) ABSTRACT

A power supply voltage is monitored by a monitoring circuit including a variable current generator and a band gap voltage generator core receiving the variable current and including a first node and a second node. A control circuit connected to the first and second nodes is configured to deliver a control signal on a first output node having a first state when an increasing power supply voltage is below a first threshold and having a second state when increasing power supply voltage exceeds the first threshold. The first threshold is at least equal to the band gap voltage. An equalization circuit also connected to the first and second nodes with feedback to the variable current generator generates the bandgap voltage at a second output node. The control signal operates to control actuation of the equalization circuit.

23 Claims, 4 Drawing Sheets

(51) Int. Cl.
*G05F 3/26* (2006.01)
*G06F 1/28* (2006.01)
*H03K 5/24* (2006.01)
*G06F 1/30* (2006.01)
*G06F 1/24* (2006.01)

(52) U.S. Cl.
CPC .................. *G06F 1/28* (2013.01); *G06F 1/30* (2013.01); *G06F 1/305* (2013.01); *H03K 5/2436* (2013.01); *G06F 1/24* (2013.01)

(58) Field of Classification Search
CPC .......... G05F 3/265; G05F 3/267; G05F 1/563; G01R 19/16552
See application file for complete search history.

(56) References Cited

U.S. PATENT DOCUMENTS

| | | |
|---|---|---|
| 7,570,090 B2 | 8/2009 | Du |
| 7,876,135 B2 | 1/2011 | Shkidt |
| 8,928,374 B2 | 1/2015 | Matsuno |
| 9,639,133 B2 | 5/2017 | Shor |
| 2005/0030090 A1* | 2/2005 | Deng ...................... G05F 3/245 327/539 |
| 2007/0046341 A1 | 3/2007 | Tanzawa |
| 2009/0219066 A1 | 9/2009 | Shkidt |
| 2012/0176186 A1* | 7/2012 | Chen ........................ G05F 3/30 327/539 |
| 2014/0253191 A1 | 9/2014 | Matsuno |
| 2015/0042386 A1 | 2/2015 | Bhowmik et al. |
| 2017/0244406 A1 | 8/2017 | Yasunaka |

* cited by examiner

ELECTRONIC CIRCUIT WITH DEVICE FOR MONITORING A POWER SUPPLY USING A TRIP THRESHOLD CHOSEN FROM A RANGE OF VOLTAGES AROUND A BAND GAP VOLTAGE

PRIORITY CLAIM

This application claims the priority benefit of French Application for Patent No. 1759914, filed on Oct. 20, 2017, the content of which is hereby incorporated by reference in its entirety to the maximum extent allowable by law.

TECHNICAL FIELD

Embodiments of the invention relate to integrated circuits, and in particular managing the start-up and operation of the integrated circuits as a function of the power supply voltage.

BACKGROUND

In order to avoid integrated circuit malfunctions, there are devices that make it possible to delay the start-up of an electronic circuit until the power supply voltage of the circuit has reached a first threshold.

These devices can also switch off the integrated circuit if the power supply voltage passes below a second threshold, the first threshold conventionally being able to be equal to or lower than the first threshold.

These devices are known to the person skilled in the art as "Power On Reset circuits" (POR circuits).

However, the existing systems present certain drawbacks, in particular an excessive error margin, of the order of 10 to 20%. This error margin can moreover vary as a function of the temperature, of the voltage threshold, or of the technology of the integrated circuit.

Other devices exhibit a satisfactory accuracy, but do not make it possible to choose the first threshold and the second threshold with values lower than a certain limit, for example 1.2 Volts.

There is therefore a need to improve this type of device.

Thus, according to one embodiment, a device is proposed for monitoring the power supply of an integrated circuit, having a high level of accuracy and insensitive to changes of temperature, of voltage threshold or of fabrication method, and that makes it possible to set a start-up threshold within a greater range of values.

SUMMARY

According to one aspect, an electronic circuit is proposed comprising a power supply node configured to receive a power supply voltage, a first output node and a reference node intended to receive a reference voltage, and comprising a device for monitoring the power supply voltage, comprising a band gap voltage generator core comprising a first node and a second node coupled to the power supply node via a current power supply module configured to supply the band gap voltage generator core with an adjustable current, and a control circuit connected to the two nodes of the band gap voltage generator core and configured to deliver, on the first output node, a control signal having a first state when the power supply voltage increases and remains below a first threshold adjustable as a function of the value of said current and corresponding to an equality between the first and second nodes, and a second state when the power supply voltage becomes greater than or equal to the first threshold.

Thus, a band gap generator core can be advantageously used to detect the equality between its first and its second nodes. The power supply voltage at the time of this detection corresponds to the first threshold.

The band gap voltage generator core allows for a particularly accurate detection of the voltage threshold, being insensitive to the variations of temperature, of fabrication method or of voltage threshold.

Furthermore, the use of a band gap voltage generator core supplied with current advantageously makes it possible, by modulating the current appropriately, to obtain a threshold voltage over a wide range of values, notably comprising values less than 1.2 Volts, but also values greater than or equal to 1.2 Volts.

In other words, the first threshold can be less than, greater than or equal to a band gap voltage.

A band gap voltage generator core structure that is particularly simple to produce and small in terms of surface area uses PNP transistors and three resistors. This example is however of course non-limiting, other band gap voltage generator core structures being able to be envisaged.

More specifically, according to this non-limiting example, the band gap voltage generator core comprises two branches respectively coupled to the two nodes of the band gap voltage generator core and respectively comprising diode-mounted PNP bipolar transistors configured to exhibit different current densities, the branch exhibiting the greatest current density further comprising a main resistor.

The band gap voltage generator core also comprises two auxiliary resistors respectively connected between the two nodes of the band gap voltage generator core and a reference node intended to receive a reference voltage, for example the ground.

The current power supply module can comprise: a current generator coupled between the power supply node and the reference node controllable by the power supply voltage and configured to generate said adjustable current, a first current mirror coupled between the power supply node and the first node, and a second current mirror coupled between the power supply node and the second node, the first and the second current mirrors being configured to copy the adjustable current delivered by the current generator.

The first voltage threshold can be less than, greater than or equal to the band gap voltage.

The current generator can comprise an MOS transistor coupled in series with an adjustment resistor, the value of which contributes to adjusting the value of the adjustment current.

Thus, it is advantageously possible to modify the first voltage threshold by adjusting the value of the adjustment resistor.

The control circuit can be configured to deliver the control signal in its first state when the power supply voltage drops back below the first threshold.

According to one embodiment, the control circuit comprises a first comparator of which a first input is coupled to the first node, of which a second input is coupled to the second node, and of which the output is coupled to the first output node.

According to one embodiment, the circuit can comprise a band gap voltage generator incorporating the band gap voltage generator core, having an equalization circuit that can be activated by the control signal, and a second output node, the equalization circuit being deactivated when the control signal is in its first state, and activated when the control signal is in its second state, the second output node being able to deliver the band gap voltage when the equalization circuit are activated.

Thus, one and the same band gap voltage generator core is used for the device and for the band gap voltage generator, which advantageously allows for a saving on surface area compared to a circuit in which the device and the band gap voltage generator would each use a distinct band gap voltage generator core.

It should be noted here that this aspect providing for the use of the same band gap voltage generator core for, on the one hand, a band gap voltage generator with an activatable equalization circuit and for, on the other hand, a device for monitoring the power supply voltage, is compatible with any band gap voltage generator core structure, with any current power supply module structure and regardless of the value of the first threshold.

According to one embodiment, the control circuit comprises a second comparator of which a first input is coupled to the first node, of which a second input is coupled to the second node, and of which the output is configured to generate a first signal having a first state when the power supply voltage is greater than or equal to the first voltage threshold, and a third comparator of which a first input is coupled to the second output node, of which a second input is coupled to the power supply node, and of which the output is configured to generate a second signal having the second state when the power supply voltage is greater than or equal to the first threshold, the device further comprising a logic gate of AND type of which a first input is coupled to the output of the second comparator, of which a second input is coupled to the output of the third comparator via an inverting logic gate, and of which the output is coupled to the first output node.

That advantageously makes it possible to generate a control signal when the power supply voltage drops back below the voltage threshold, despite the presence of the amplifier of the band gap voltage generator which has a higher gain than that of the first comparator.

The control circuit can be configured to deliver the control signal in its first state when the power supply voltage drops back below a second threshold lower than the first threshold.

The second input of the second comparator can be coupled to the power supply node via a voltage divider bridge, so that the third comparator is configured to generate the second signal in the first state when the power supply voltage is greater than or equal to a second voltage threshold, the second voltage threshold being lower than the first voltage threshold.

The use of voltage thresholds which are different in the rising and in the falling of the power supply voltage confers a hysteresis-like behavior on the device and advantageously makes it possible to avoid oscillation phenomena which could occur with the use of one and the same threshold.

DETAILED DESCRIPTION OF THE DRAWINGS

Figure 1:
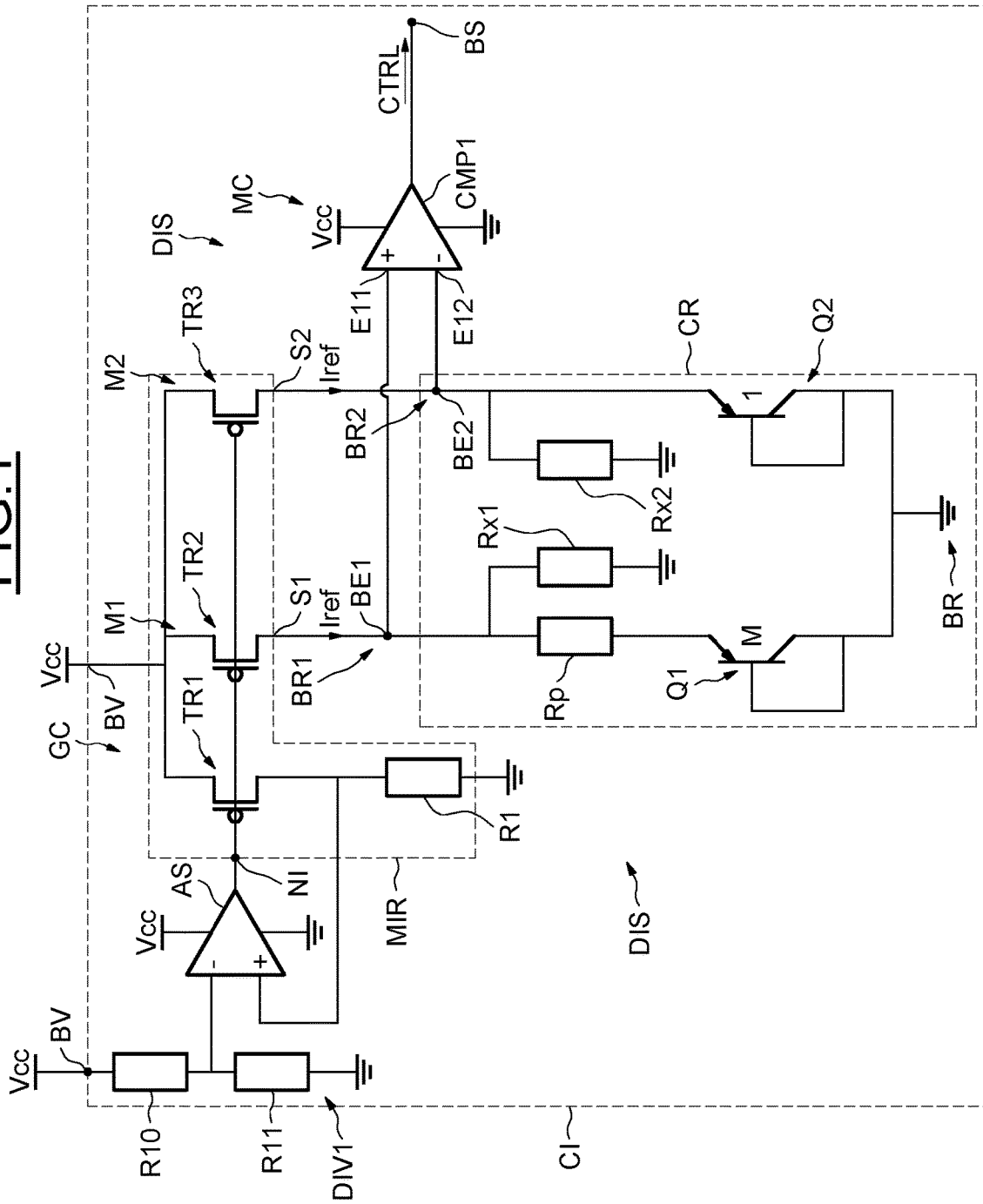
FIGS. 1 to 4 illustrate embodiments of an electronic circuit comprising a device for monitoring the general power supply.

FIG. 1 illustrates an electronic circuit CI comprising a device DIS for monitoring the general power supply of the circuit CI, configured to generate a control signal CTRL at an output node BS, intended for the integrated electronic circuit CI.

The state of the control signal CTRL changes as a function of the value of the general power supply voltage Vcc of the circuit CI, and allows the circuit CI to operate only if the power supply voltage Vcc is above a first threshold.

For example, the control signal CTRL can be in a first state, for example a low state, or in a second state, for example a high state, and the circuit CI is configured to operate when the control signal CTRL is in its second state, and to be switched off when the control signal CTRL is in its first state.

The device DIS is configured to generate the control signal CTRL having the second state when the voltage at the power supply node BV is greater than or equal to the first voltage threshold.

Here, the general power supply voltage Vcc of the integrated circuit CI is supplied by a battery (not represented), coupled to a power supply node BV of the integrated circuit CI.

The device DIS is coupled to the power supply node BV via a follower amplifier AS associated with a first voltage divider bridge DIV1, the amplifier AS configured to deliver a voltage proportional to the power supply voltage Vcc at an intermediate node NI.

The first voltage divider bridge DIV1 comprises a first bridge resistor R10 and a second bridge resistor R11, coupled in series between the power supply node BV and a reference node BR, intended to be supplied by a reference voltage, here the ground.

The intermediate node NI is here coupled between the first bridge resistor R10 and the second bridge resistor R11 via the follower amplifier AS.

The follower amplifier AS advantageously allows for insulating the current of the device DIS from the first divider bridge DIV1.

The device DIS comprises a band gap voltage generator core CR, comprising a first node BE1 and a second node BE2.

The band gap voltage generator core CR here comprises a first PNP bipolar transistor, referenced Q1, diode-mounted and connected in series with a main resistor Rp between the first node BE1 and the reference node BR. The first transistor Q1 in series with the main resistor Rp here forms a first branch BR1 of the band gap voltage generator core CR.

The band gap voltage generator core CR also comprises a second PNP bipolar transistor referenced Q2, also diode-mounted, and connected between the second node BE2 of the band gap voltage generator core and the reference node BR. The second transistor Q2 coupled between the second node BE2 and the reference node BR here forms a second branch BR2 of the band gap voltage generator core CR.

The size of the first transistor Q1 and the size of the second transistor Q2 are different, and are in a surface ratio M, such that the current density passing through the second transistor Q2 is M times greater than the current density passing through the first transistor Q1.

For example here, the size of the first transistor Q1 is eight times greater than the size of the second transistor Q2.

Obviously, it would also be possible to use a transistor Q2 and M transistors Q1 in parallel, all of the same size as the second transistor Q2.

The band gap voltage generator core CR further comprises a first auxiliary resistor Rx1 coupled between the first node BE1 and the reference node BR, and a second auxiliary resistor Rx2 coupled between the second node BE2 and the reference node BR. Here, the first auxiliary resistor Rx1 and the second auxiliary resistor Rx2 both have a value of 10 mega ohms.

A current power supply module MIR is coupled between the intermediate node NI and the device DIS, and is configured to supply the band gap voltage generator core CR with an adjustable current Iref.

The current power supply module MIR here comprises a current generator GC, configured to generate the adjustable current Iref, and comprising a first MOS transistor TR1 and a first resistor R1, or adjustment resistor, coupled in series between the power supply node and the reference node.

The gate of the first MOS transistor TR1 is coupled to the intermediate node NI.

Thus, the current generator is controlled by the voltage at the intermediate node NI, proportional to the power supply voltage Vcc, and the value of the adjustable current Iref therefore depends on the value of the power supply voltage Vcc and on the value of the first resistor R1.

The current power supply module MIR further comprises a first current mirror transistor M1, configured to supply the adjustable current Iref to the first node BE1, and a second current mirror transistor M1, configured to supply the adjustable current Iref to the second node BE2.

The first and the second current mirror transistors M1 and M2 respectively comprise a second and a third MOS transistor TR2 and TR3, coupled in series between the power supply node BV and, respectively, the first node BE1 and the second node BE2.

The gates of the second and third MOS transistors TR2 and TR3 are coupled to the intermediate node NI.

The band gap voltage generator core CR of the device DIS is here analogous to a band gap voltage generation device core supplied with current.

As is known to the person skilled in the art, a band gap voltage generator conventionally comprises, in addition to a band gap voltage generator core analogous to the band gap voltage generator core CR described previously, an equalization circuit comprising an amplifier and a feedback stage configured to equalize the voltage at the first node BE1 and at the second node BE2 of the band gap voltage generator core CR. And, when the voltage at the first node BE1 is equal to the voltage at the second node BE2, the adjustable current Iref flowing in the first branch BR1 and in the second branch BE2 is equal to a band gap current from which it is possible to obtain a band gap voltage.

A band gap voltage is independent of temperature.

Thus, the equalization circuit makes it possible to keep the voltages equal at the first and second nodes BE1 and BE2, and therefore maintain a band gap voltage at the intermediate node NI.

That is possible with a ratio between the value of the main resistor Rp and the value of the auxiliary resistors Rx1 and Rx2 of the order of 10. For example here, the main resistor Rp has a value of 1 mega ohm.

It is therefore known to the person skilled in the art that, when the voltages at the first and second nodes BE1 and BE2 are equal, the adjustable current Iref is a band gap current that is particularly stable.

The band gap current is obtained with a great level of accuracy, of the order of 1 to 3%. It is therefore advantageous to use the equality between the two voltages at the nodes BE1 to define the first threshold.

Thus, the first threshold corresponds to the value of the power supply voltage when the adjustable current is a band gap current, that is to say when the voltage at the first node BE1 is equal to the voltage at the second node BE2. Here, the first threshold is equal to 1.2 Volts.

Here, the device DIS does not comprise equalization circuit, the voltages at the first node BE1 and at the second node BE2 are not therefore kept equal.

The device DIS comprises control circuit MC, here comprising a first comparator CMP1 of which a first input E11 is coupled to the first node BE1, a second input E12 is coupled to the second node BE2, and of which the output is coupled to the first output node BS1 of the device DIS.

The first comparator CMP1 is here configured to generate the control signal CTRL in its second state when the voltage at the first node BE1 is greater than or equal to the voltage at the second node BE2.

In other words, the first comparator CMP1 generates the control signal CTRL having its first state when the power supply voltage has reached the first threshold.

In operation, on starting up the general power supply, the voltage Vcc increases progressively to its maximum value.

In a first phase, the voltage Vcc is lower than the first threshold, and the voltage at the first node BE1 is lower than the voltage at the second node BE2.

As the power supply voltage Vcc approaches the first threshold, the difference between the voltage at the first node BE1, that is to say on the first input E11 of the first comparator CMP1, and the voltage at the second node, that is to say on the second input E12 of the first comparator CMP1, decreases.

A second phase begins when the value of the power supply voltage Vcc reaches the first threshold, that is to say when the adjustable current Iref is a band gap current. The voltages at the nodes BE1 and BE2 are then equal.

The power supply voltage Vcc continues to increase from the first threshold to its maximum value, at which it stabilizes. In this second phase, the voltage at the first node BE1 is therefore equal, then greater than the voltage at the second node BE2.

The first comparator CMP1 therefore delivers the control signal CTRL having its second state and the electronic circuit CI starts its operation.

And, during the operation of the integrated circuit CI, it is possible, because of a malfunction, for the power supply to drop abruptly. In the case where the power supply voltage Vcc drops below the first threshold, that is to say also if the voltage at the first node BE1 once again becomes lower than the voltage at the second node BE2, the first comparator CMP1 delivers the control signal CTRL in its first state and the integrated circuit CI stops its operation.

It is therefore possible here to ensure that the integrated circuit CI does not operate if the power supply voltage Vcc is too low.

Furthermore, as indicated above, the use of the band gap voltage generator core CR, analogous to a band gap voltage generator core, makes it possible to obtain the first threshold with a high level of accuracy, by obtaining a first threshold with an accuracy of 1 to 3%.

Furthermore, the adjustment of the value of the first resistor R1 advantageously makes it possible to modify the value of the adjustable current Iref, and therefore the threshold voltage.

In order to modify the value of the first threshold voltage, it would also be possible to vary the values of the bridge resistors R10 and R11.

As an indication, here, when the adjustable current has a band gap current value, the voltage at the power supply node is equal to 1 Volt.

Figure 2:
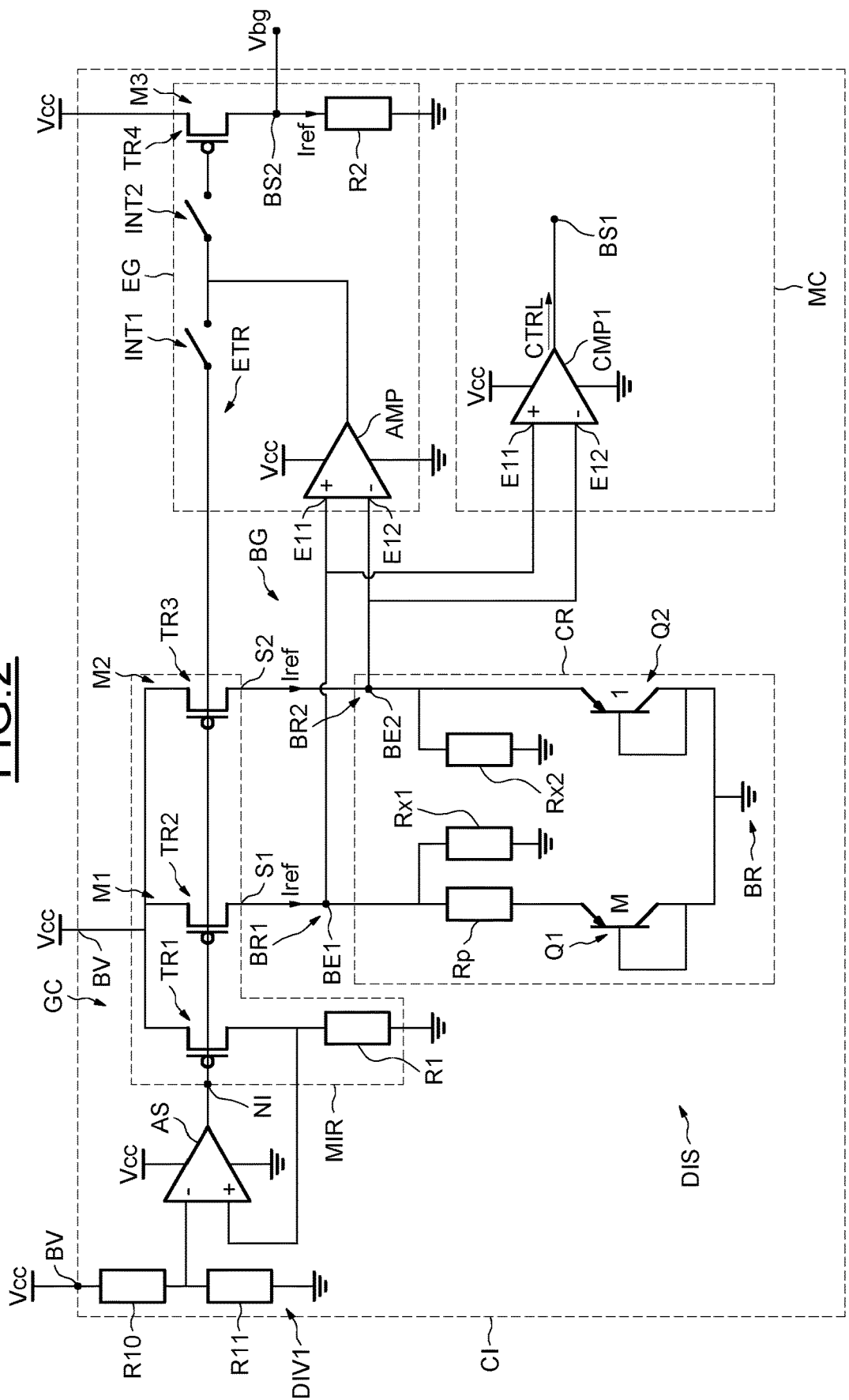

FIG. 2 illustrates an embodiment in which the band gap voltage generator core CR of the device DIS is shared with a band gap voltage generator BG.

The band gap generator BG comprises the band gap voltage generator core CR, and an equalization circuit EG comprising an amplifier AMP whose inverting input is coupled to the first node BE1 of the band gap voltage generator core CR, and whose non-inverting input is coupled to the second node BE2 of the band gap voltage generator core CR, and a second output node BS2.

The equalization circuit EG further comprise a feedback coupling between the output of the amplifier AMP, coupled here to the second output node BS2, and the intermediate node NI via a first switch INT1 controlled by the control signal CTRL. The first switch INT1 is configured to be in an open state when the control signal CTRL is in its first state, and in a closed state when the control signal CTRL is in its second state.

The band gap voltage generator BG further comprises a third current mirror transistor M3, comprising a fourth MOS transistor TR4 and a second resistor R2 coupled between the power supply node BV and the reference node BR.

The gate of the fourth MOS transistor is coupled to the intermediate node NI via the first switch INT1 and a second switch INT2 configured to be in an open state when the control signal CTRL is in its first state, and in a closed state when the control signal CTRL is in its second state.

The second output node BS2 is coupled here between the fourth MOS transistor TR4 and the second resistor R2.

Thus, when the amplifier AMP is activated, and the switches INT1 and INT2 are closed, the second node BS2 delivers a voltage Vbg proportional to a band gap voltage. The value of this voltage Vbg proportional to a band gap voltage depends on the value of the adjustable current Iref and on the value of the second resistor R2.

Here, the value of the second resistor R2 is advantageously chosen such that the voltage Vbg proportional to a band gap voltage corresponds to the first threshold.

The amplifier AMP can be activated by the control signal CTRL and is configured to be activated when the control signal CTRL is in its second state.

In operation, when the power supply voltage reaches the first threshold, the first comparator CMP1 delivers the control signal CTRL in its second state, the amplifier AMP is activated, and the switches INT1 and INT2 are closed. The second output node BS2 therefore delivers the voltage Vbg proportional to a band gap voltage.

It is thus possible to use an existing band gap voltage generator core in the integrated circuit to produce the device DIS. This advantageously allows a surface saving on the device, compared to a circuit comprising a band gap voltage generator which would be separate from the device DIS.

That being the case, the first comparator CMP1, the follower amplifier AS, and the amplifier AMP operate simultaneously, but, since the amplifier AMP has a higher gain, it imposes a voltage on the intermediate node NI that makes it possible to keep the adjustable current Iref at a band gap current value. The voltages at the first node BE1 and at the second node BE2 are therefore kept equal by the amplifier AMP.

Thus, if the power supply voltage Vcc decreases, for example so as to pass once again below the first threshold, the voltages at the first and second nodes BE1 and BE2 do not vary, and therefore the output of the first comparator CMP1 is not able to deliver the control signal CTRL in its first state.

It is not therefore possible to detect a drop in the power supply voltage Vcc in which the power supply voltage Vcc would once again pass below the first threshold.

Figure 3:
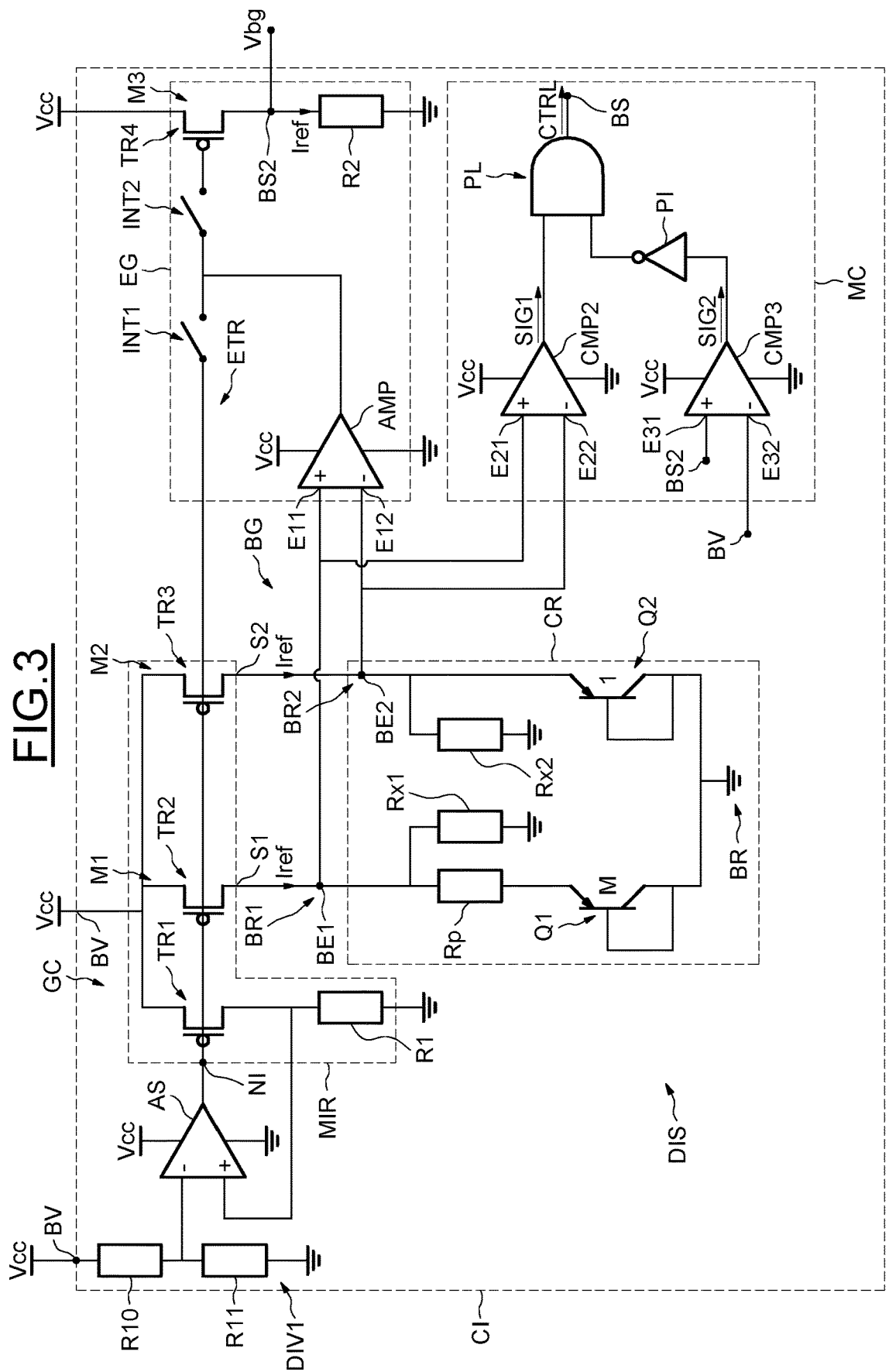

In order to be able to detect such a voltage drop, it is possible, as illustrated by FIG. 3, for a comparison circuit MC to comprise, in place of the first comparator CMP1, a second comparator CMP2 of which a first input E21 is coupled to the first node BE1, a second input E22 is coupled to the second node BE2, and a third comparator CMP3, of which a first input E31 is coupled to the second output node BS2, and of which a second input E32 is coupled to the power supply node BV so as to receive the power supply voltage Vcc.

In order to avoid oscillation phenomena when the value of the power supply voltage crosses the voltage threshold, the second and third comparators CMP2 and CMP3 are, here, hysteresis comparators.

Furthermore, the amplifier AMP and the third comparator CMP3 can be activated by the control signal CTRL.

In particular, when the control signal CTRL is in its first state, the amplifier AMP and the third comparator CMP3 are deactivated, and when the control signal CTRL is in its second state, the amplifier AMP and the third comparator CMP3 are activated.

The second comparator CMP2 is configured to deliver a first signal SIG1 having a first state, here a low state, if the power supply voltage is lower than the first voltage threshold, that is to say if the voltage at the first node BE1 is lower than the voltage at the second node BE2, and having a second state, here a high state, if the power supply voltage is greater than or equal to the first voltage threshold, that is to say if the voltage at the first node BE1 is greater than or equal to the voltage at the second node BE2.

The third comparator CMP3 is configured to, when it is activated, deliver the second signal SIG2 having a first state, here a low state, if the voltage on its second input E32, here the power supply voltage Vcc, is greater than or equal to the voltage on its first input E31, here the voltage on the second output node BS2, and to deliver the second signal SIG2 in a second state, here a high state, if the voltage on its second input E32 is lower than the voltage on its first input E31.

When the third comparator CMP3 is deactivated, its output delivers a low state. For example, the output of the third comparator CMP3 can be coupled to a circuit comprising pull-down transistors that can be activated by the control signal CTRL.

The second comparator CMP2 and the third comparator CMP3 here each have their output coupled to the input of a logic gate PL.

The logic gate PL has its output coupled to the first output node BS of the device DIS, and is configured to deliver the control signal CTRL.

In operation, for example on start-up of the circuit CI, the power supply voltage Vcc increases progressively to its maximum value.

In a first phase, during which the power supply voltage Vcc increases while remaining below the first threshold, the voltage at the first node BE1 is lower than the voltage at the second node BE2, and the second comparator CMP2 delivers the first signal SIG1 in its first state.

The third comparator CMP3 is deactivated and delivers a low state. The inverting gate PI therefore delivers a high state at the input of the logic gate PL.

Thus, the states of the two inputs of the logic gate PL of AND type are different, the logic gate PL therefore delivers the control signal CTRL in its first state.

In a second phase, beginning when the first voltage threshold is reached, that is to say when the voltages at the first and second nodes BE1 and BE2 are equal, the second comparator CMP2 delivers the first signal SIG1 having a high state.

Thus, the inputs of the logic gate PL are both in the high state, and the logic gate PL, the output of which is coupled to the output node BS, delivers the control signal CTRL having a high state.

On reception of the control signal CTRL having the second value, the circuit CI begins its operation, the switches INT1 and INT2 are in the closed position, and the amplifier AMP and the third comparator CMP3 are activated.

Thus, the first input E31 of the third comparator CMP3, coupled to the second output node BS2, receives the voltage Vbg proportional to a band gap voltage, which is here equal to the first threshold, and which is therefore in the second phase lower than the power supply voltage Vcc received on the second input E32.

The third comparator CMP3 therefore continues to deliver the second signal SIG2 having a low state.

Since the amplifier AMP has a higher gain, it imposes the band gap voltage on the intermediate node NI, here 1.2 Volts.

And, if the power supply voltage Vcc decreases to pass once again below the first threshold, then the third comparator CMP3 delivers the second signal SIG2 having a high state.

The inverting gate PI therefore delivers a high state, the inputs of the logic gate PL of AND type are therefore different.

The logic gate PL therefore delivers the control signal CTRL having the first state, here a low state, and the circuit CI then ceases its operation.

It is also possible to define a second threshold, lower than the first voltage threshold, used when the power supply voltage drops.

That advantageously makes it possible to avoid phenomena of oscillation of the device when the value of the power supply voltage reaches the voltage threshold, and therefore make the device more stable.

Figure 4:
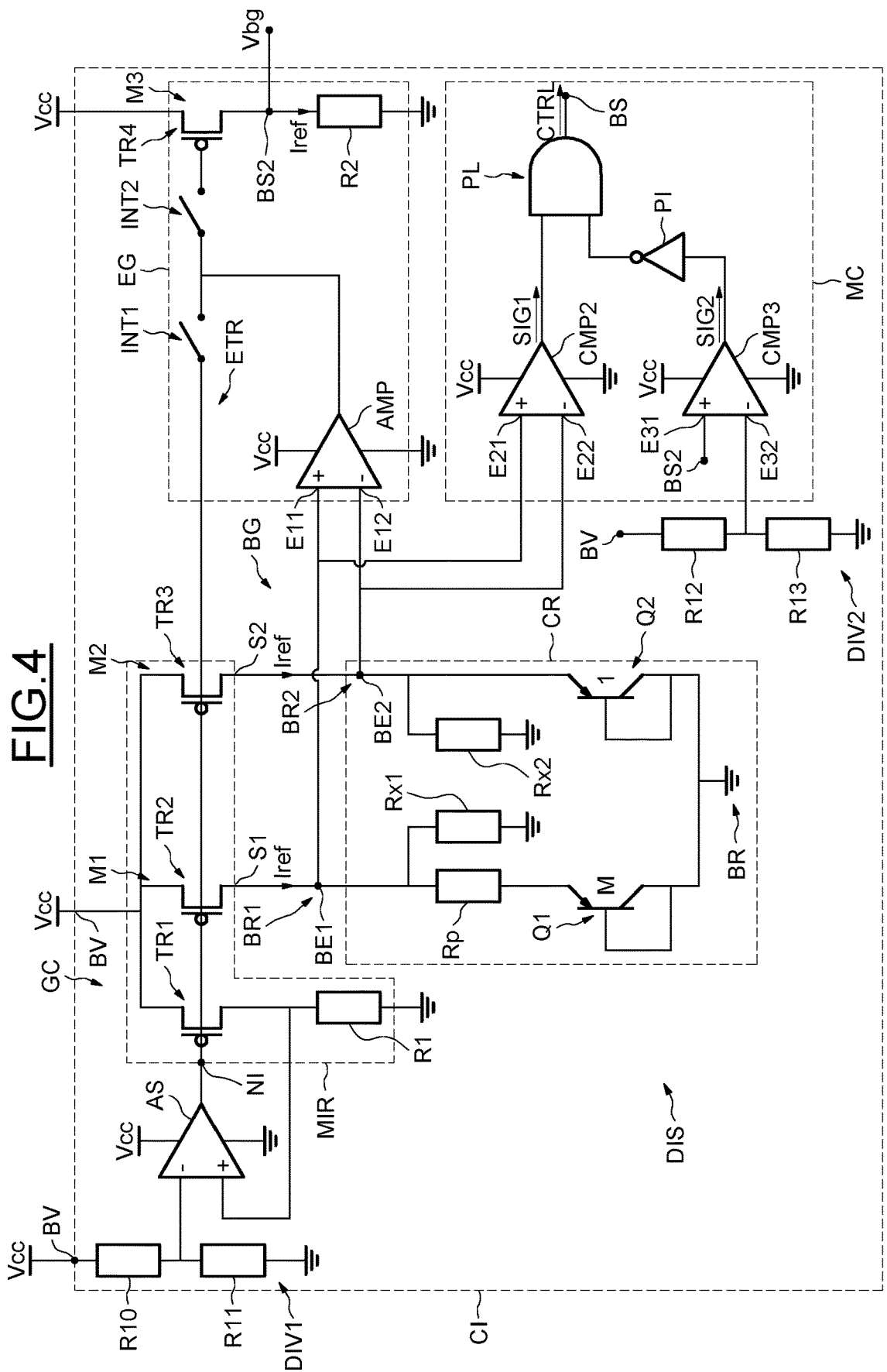

As FIG. 4 illustrates, it is possible for that to couple the second input E32 of the third comparator CMP3 to the power supply node BV via a second voltage divider bridge DIV2 delivering a voltage equal to the power supply voltage Vcc divided by a first factor.

The second voltage divider bridge DIV2 here comprises a third bridge resistor R12 and a fourth bridge resistor R13, the values of which are chosen such that the second voltage threshold multiplied by said first factor is equal to the voltage Vbg proportional to a band gap voltage.

The invention is not limited to the embodiments which have just been described but encompasses all the variants.

Thus, the invention is compatible with any band gap voltage generator core structure and any current power supply module structure.

The invention claimed is:

1. An electronic circuit, comprising:
   a power supply node configured to receive a power supply voltage;
   a first output node;
   a current power supply module coupled to the power supply node and configured to supply an adjustable current; and
   a device for monitoring the power supply voltage, comprising:
   a band gap voltage generator core coupled to receive the adjustable current and including a first node and a second node; and
   a control circuit connected to the first and second nodes of the band gap voltage generator core and configured to deliver, on the first output node, a control signal having a first logic state when said power supply voltage is increasing but is below a first threshold and having a second logic state opposite the first logic state when the power supply voltage increases to a level that is greater than or equal to the first threshold;
   wherein the first threshold is adjustable as a function of the value of said adjustable current and corresponds to an equality of voltages at the first and second nodes; and
   wherein the control circuit comprises a first comparator having a first input coupled to the first node, a second input coupled to the second node, and an output configured to generate the control signal at the first output node.

2. The circuit according to claim 1, further comprising a voltage power supply module configured to supply the current power supply module at an intermediate node with a voltage derived from the power supply voltage.

3. The circuit according to claim 1, wherein the current power supply module comprises:
   a current generator coupled between the power supply node and a reference node, controllable by the power supply voltage and configured to generate said adjustable current;
   a first current mirror coupled between the current generator and the first node; and
   a second current mirror coupled between the current generator and the second node;
   wherein the first and second current mirrors are configured to copy the adjustable current generated by the current generator.

4. The circuit according to claim 3, wherein the current generator comprises an MOS transistor coupled in series with an adjustment resistor having a resistance value which contributes to adjusting a value of the adjustable current.

5. The circuit according to claim 1, wherein the control circuit is configured to deliver the control signal in the first logic state when a decrease in the power supply voltage falls below the first threshold.

6. The circuit according to claim 1, further comprising:
   an equalization circuit having a first input coupled to the first node, a second input coupled to the second node and an output coupled in feedback to the current power supply module, the equalization circuit being deactivated when the control signal is in its first logic state and being activated when the control signal is in its second logic state to generate a band gap voltage at a band gap voltage output of the equalization circuit.

7. The circuit according to claim 6, further comprising:
   a second comparator having a first input coupled to the output of the equalization circuit, a second input coupled to the power supply node, and an output configured to generate a second signal having a first logic state when the power supply voltage is greater than or equal to a voltage at the output of the equalization circuit; and
   a logic circuit configured to logically combine the first and second signals to generate the control signal at the first output node.

8. The circuit according to claim 7, wherein the logic circuit comprises:
an inverter configured to invert the second signal; and
an AND gate having a first input configured to receive the first signal and a second input configured to receive the inverted second signal.

9. The circuit according to claim 7, wherein the control circuit is configured to deliver the control signal in the first logic state when a decrease in the power supply voltage falls below a second threshold lower than the first threshold.

10. The circuit according to claim 7, wherein the second input of the second comparator is coupled to the power supply node via a voltage divider bridge, so that the second comparator is configured to generate the second signal in the first logic state when a voltage output from the voltage divider bridge is greater than or equal to the voltage at the output of the equalization circuit.

11. The circuit according to claim 1, wherein a first voltage and a second voltage are respectively generated at the first and second nodes from first and second currents passing through circuitry of the band gap voltage generator core having two different current densities.

12. The circuit according to claim 1, wherein the band gap voltage generator core comprises:
first and second circuit branches respectively coupled to the first and second nodes and respectively comprising diode-mounted PNP bipolar transistors configured to exhibit different current densities;
a first resistor in one of the first and second circuit branches which exhibits a higher current density; and
two auxiliary resistors respectively connected between the first and second nodes and a common reference node.

13. An electronic circuit, comprising:
a power supply node configured to receive a power supply voltage;
a first output node;
a current power supply module coupled to the power supply node and configured to supply an adjustable current; and
a device for monitoring the power supply voltage, comprising:
a band gap voltage generator core coupled to receive the adjustable current and including a first node and a second node; and
a control circuit connected to the first and second nodes of the band gap voltage generator core and configured to deliver, on the first output node, a control signal having a first state when said power supply voltage is increasing but is below a first threshold and having a second state when the power supply voltage increases to a level that is greater than or equal to the first threshold;
wherein the first threshold is adjustable as a function of the value of said adjustable current and corresponds to an equality of voltages at the first and second nodes; and
an equalization circuit having a first input coupled to the first node, a second input coupled to the second node and an output coupled in feedback to the current power supply module, the equalization circuit being deactivated when the control signal is in its first state and being activated when the control signal is in its second state to deliver a band gap voltage at a band gap output of the equalization circuit.

14. The circuit according to claim 13, further comprising a voltage power supply module configured to supply the current power supply module with a voltage derived from the power supply voltage an intermediate node.

15. The circuit according to claim 13, wherein the current power supply module comprises:
a current generator coupled between the power supply node and a reference node, controllable by the power supply voltage and configured to generate said adjustable current;
a first current mirror coupled between the current generator and the first node; and
a second current mirror coupled between the current generator and the second node;
wherein the first and second current mirrors are configured to copy the adjustable current generated by the current generator.

16. The circuit according to claim 15, wherein the current generator comprises an MOS transistor coupled in series with an adjustment resistor having a resistance value which contributes to adjusting a value of the adjustable current.

17. The circuit according to claim 13, wherein the control circuit is configured to deliver the control signal in the first state when a decrease in the power supply voltage falls below the first threshold.

18. The circuit according to claim 13, wherein the control circuit comprises:
a first comparator having a first input coupled to the first node, a second input coupled to the second node, and an output configured to generate a first signal having a first state when the power supply voltage is greater than or equal to the first voltage threshold;
a second comparator having a first input coupled to the output of the equalization circuit, a second input coupled to the power supply node, and an output configured to generate a second signal having a first state when the power supply voltage is greater than or equal to the band gap voltage at the output of the equalization circuit; and
a logic circuit configured to logically combine the first and second signals to generate the control signal at the first output node.

19. The circuit according to claim 18, wherein the logic circuit comprises:
an inverter configured to invert the second signal; and
an AND gate having a first input configured to receive the first signal and a second input configured to receive the inverted second signal.

20. The circuit according to claim 18, wherein the control circuit is configured to deliver the control signal in the first state when a decrease in the power supply voltage falls below a second threshold lower than the first threshold.

21. The circuit according to claim 18, wherein the second input of the second comparator is coupled to the power supply node via a voltage divider bridge, so that the second comparator is configured to generate the second signal in the first state when a voltage at an output of the voltage divider bridge is greater than or equal to the band gap voltage at the output of the equalization circuit.

22. The circuit according to claim 13, wherein a first voltage and a second voltage are respectively generated at the first and second nodes from first and second currents passing through circuitry of the band gap voltage generator core having two different current densities.

23. The circuit according to claim 13, wherein the band gap voltage generator core comprises:
first and second circuit branches respectively coupled to the first and second nodes and respectively comprising diode-mounted PNP bipolar transistors configured to exhibit different current densities;

a first resistor in one of the first and second circuit branches which exhibits a higher current density; and two auxiliary resistors respectively connected between the first and second nodes and a common reference node.

* * * * *